(12) United States Patent
Saeki et al.

(10) Patent No.: US 6,586,922 B2
(45) Date of Patent: Jul. 1, 2003

(54) PHASE SHIFT CIRCUIT AND FM DETECTOR CIRCUIT

(75) Inventors: Takao Saeki, Gunma (JP); Hiroya Yamamoto, Ashikaga (JP); Takashi Iijima, Gunma (JP); Jun Suzuki, Gunma (JP); Masaki Kinoshita, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/821,395

(22) Filed: Mar. 28, 2001

(65) Prior Publication Data

US 2001/0033158 A1 Oct. 25, 2001

(30) Foreign Application Priority Data

Mar. 31, 2000 (JP) .......................................... 2000-098387
Mar. 27, 2001 (JP) .......................................... 2001-089294

(51) Int. Cl.[7] .............................................. G01R 25/00
(52) U.S. Cl. ................................ 324/76.78; 329/336
(58) Field of Search ....................... 329/336; 327/238; 324/76.78, 76.77

(56) References Cited

U.S. PATENT DOCUMENTS 4,970,469 A * 11/1990 Kasperkovitz .............. 329/336

* cited by examiner

*Primary Examiner*—Christine K. Oda
(74) *Attorney, Agent, or Firm*—Hogan & Hartson, LLP (57) ABSTRACT

Transistors (12$a$, 12$b$) turn on and off with mutually opposite phase input signals. Capacitors (16$a$, 16$b$) discharge when the transistors (12$a$, 12$b$) turn on, and capacitors (16$a$, 16$b$) are charged by constant current from constant current sources (18$a$, 18$b$) when the transistors (12$a$, 12$b$) turn off. As a result, a gradually rising voltage is obtained at the positive input ends of comparators (14$a$, 14$b$) while the input signals are L. By comparing this with fixed voltages of reference sources (20$a$, 20$b$), signals having rise timing shifted from input signals by 90° are obtained. The outputs of the comparators (14$a$, 14$b$) are mutually shifted by 180°, and at the rise of these outputs, an RS flip-flop (22) is set and reset so that signals delayed in phase by 90° with respect to the input signals are obtained at its outputs.

6 Claims, 7 Drawing Sheets

PHASE SHIFT CIRCUIT AND FM DETECTOR CIRCUIT

BACKGROUND OF THE INVENTION

1. Field of the Invention

The present invention relates to a phase shift circuit for shifting the phase of a rectangular input signal by a predetermined time prior to output, and an FM detector circuit using the phase shift circuit.

2. Description of the Related Art

Heretofore, a quadrature detector circuit has been used for the FM detector circuit. The quadrature detector circuit shapes a delay signal by shifting the phase of an IF (intermediate frequency) signal by a predetermined time (substantially 90° with respect to the center frequency), and performs FM detection by multiplying this delay signal with the IF signal. Therefore, the phase shift circuit becomes necessary for producing the delay signal.

The phase shift circuit comprises an ordinary phase shift circuit using coils and capacitors, a ceramic resonator, or the like.

However, in such a conventional phase shift circuit, the problems are that the coil and the ceramic resonator are external parts, circuit integration is difficult, and the circuit tends to become large.

Furthermore, although it is possible to use a delay line or the like, the problems are that the circuit becomes large, the temperature dependence increases, and so forth.

SUMMARY OF THE INVENTION

Taking into consideration the above-mentioned problems, it is an object of the present invention to provide a phase shift circuit having a simple configuration and performing phase shifts with stable delay times, and a detector circuit using this phase shift circuit.

In the present invention, a voltage rising at a predetermined slope is obtained by charging a capacitor with current from a constant current source. Thus, by setting a desired time (predetermined time) for delaying the point where the voltage exceeds a reference voltage, a pulse signal having a phase delayed by the predetermined time is obtained. On the other hand, a pulse signal having a phase delayed by the predetermined time can also be obtained in a similar manner for the inverted input signal. Thus, signals having their phases delayed by the predetermined time from the input signal from the rise of these two signals can be obtained.

In this manner, according to the present invention, signals having their phases delayed by predetermined times can be obtained from a simple circuit without the need for coils. Furthermore, resonators, delay lines, or the like are also unnecessary.

DETAILED DESCRIPTION OF THE PREFERRED EMBODIMENTS

Embodiments of the present invention will be described hereinafter with reference to the drawings.

Figure 1:
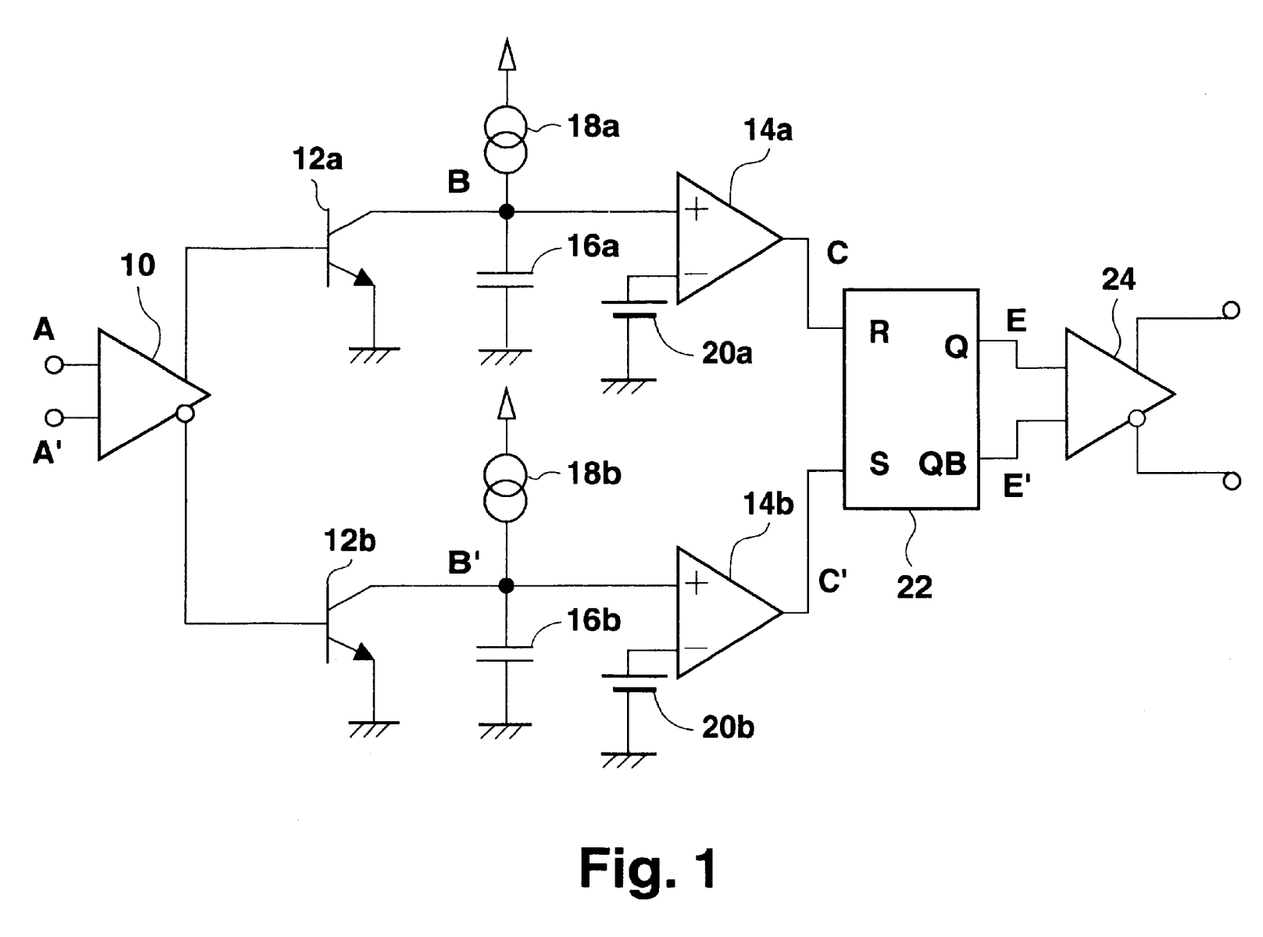
FIG. 1 is a block diagram showing a configuration of an embodiment.

FIG. 1 is a block diagram showing a configuration of a phase shift circuit concerning the embodiment. A first and second input signals having opposite phases (180° out of phase) are input by an amplifier 10. The first and second input signals are, for example, IF (intermediate frequency) signals for a desired FM radio station, and shaped as rectangular waves. The amplifier 10 performs a predetermined amplification for these two signals and supplies them respectively to two transistors 12*a* and 12*b*. The signals supplied to the transistors 12*a* and 12*b* are also opposite in phase and have rectangular waveforms.

The base of the transistor 12*a* accepts the first signal, the emitter is connected to ground, and the collector is connected to a positive input end of a comparator 14*a*. Furthermore, to the positive input end of the comparator 14*a* are connected a capacitor 16*a*, which has its other end connected to ground, and a current source 18*a*, which has its other end connected to a power source.

Furthermore, to the negative input end of the comparator 14*a* is connected a reference power source 20*a*, which has its other end connected to ground. The output of the comparator 14*a* is input by a reset terminal R of an RS flip-flop 22.

On the other hand, the base of the transistor 12*b* accepts the second input signal, the emitter is connected to ground, and the collector is connected to the positive input end of the comparator 14*b*. Furthermore, to the positive input end of the comparator 14*b* are connected a capacitor 16*b*, which has its other end connected to ground, and a current source 18*b*, which has its other end connected to a power source. Furthermore, to the negative input end of the comparator 14*b* is connected a reference power source 20*b*, which has its other end connected to ground.

Furthermore, the output of the comparator 14*b* is input by a set terminal S of the RS flip-flop 22. A Q output terminal and a QB output terminal, which is an inverted output, of the RS flip-flop 22 respectively output signals via a buffer circuit 24.

The operation of this sort of circuit will be described with reference to the various waveform diagrams in FIG. 2. As indicated by A in the figure, the first and second input signals are rectangular waveforms having a substantially fixed frequency (IF). The input signals are FM modulated and the change in frequency is FM demodulated at a subsequent stage.

As one example, FIG. 1 considers a case where the reference voltage (threshold voltage) of the reference power source 20*a*, the capacitor 16*a*, and the constant current source 18*a* is set so that the phase delay when there is no IF frequency deviation is 90°. The phase delay of 90° is with respect to the center frequency of the FM modulation signal.

The circuit from the transistor 12*a* to the output of the comparator 14*a* and the circuit from the transistor 12*b* to the output of the comparator 14*b* are identical. Since their input signals are opposite in phase, the output of the comparator 14*b* is opposite in phase with the output signal of the comparator 14*a*. The subscripts "a" and "b" will be omitted in the following description.

Figure 2:
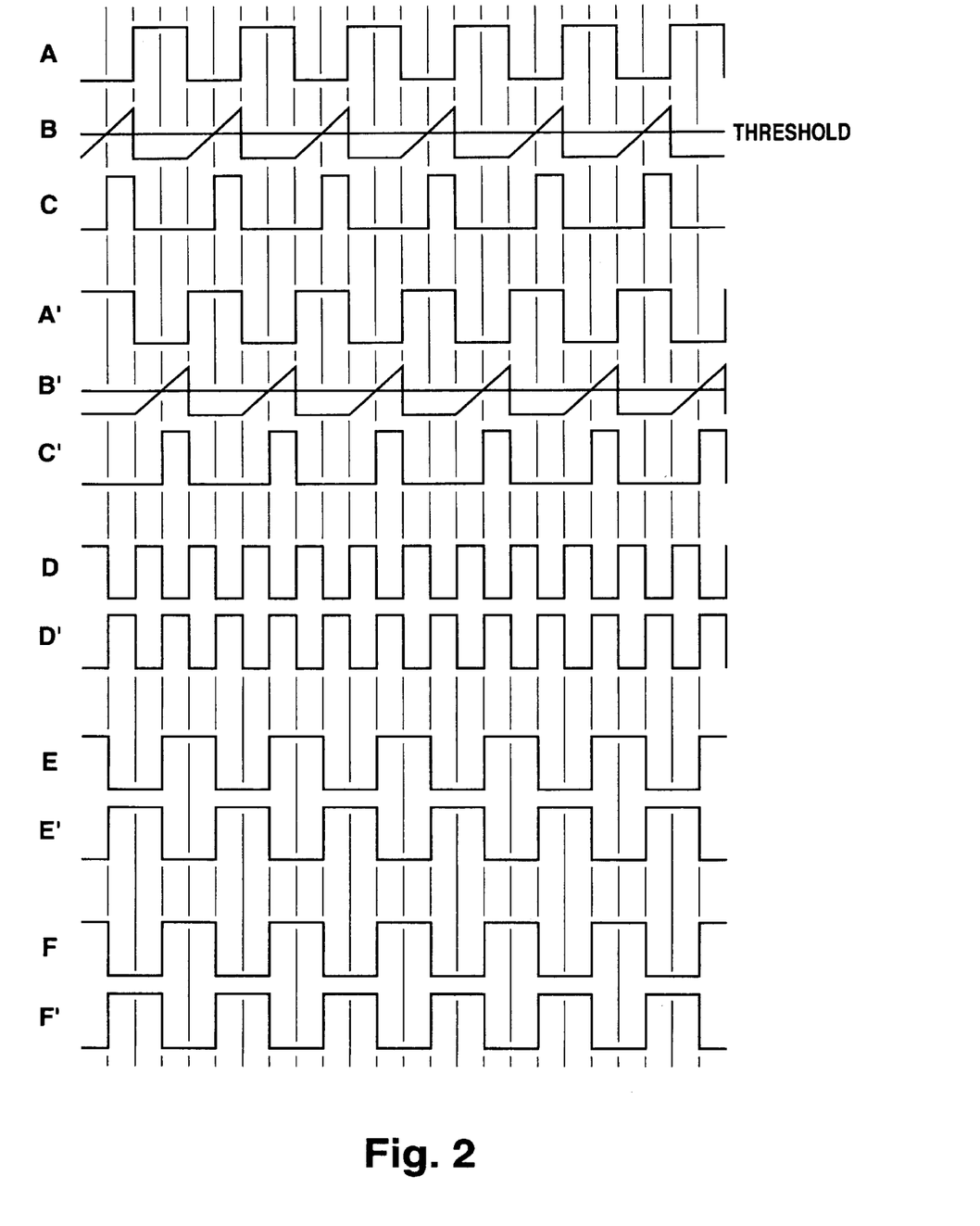
FIG. 2 shows waveforms at various points in the same embodiment.

Since the input signal indicated by A in FIG. 2 is connected to the base of transistor 12, the top side of the capacitor 16, namely, the positive input end of the comparator 14, is connected to ground during the period in which the input signal is H. On the other hand, since a predetermined fixed current is sent to the capacitor 16 by the constant current source 18 during the period in which the input signal is L, the capacitor 16 is charged in accordance with this current and the voltage at the positive input end of the comparator 14 rises linearly at a predetermined slope at a point indicated by B in FIG. 2. On the other hand, the charge in the capacitor 16 is discharged instantly when the transistor 12 turns on. Therefore, the signal at the positive input end of the comparator 14, as indicated by B in FIG. 2, rises at a fixed slope during the period in which the input signal is L and is continuously L during the period in which the input signal is H.

The comparator 14 compares the gradually rising voltage at this positive input end with the voltage of the reference power source 20. The output is H when the voltage of the positive input end exceeds the voltage of the reference power source 20.

Then, by appropriately setting beforehand the capacitance of the capacitor 16, the current capacity of the constant current source 18, and the voltage of the reference power source 20, at the point when the input signal passes exactly ½ the period of L, the input voltage at the positive input end of the comparator 14 exceeds the voltage of the reference power source 20, and the output becomes H as shown in the figure. Thereafter, when the input signal becomes H, the output of the comparator 14 becomes L. Thus, the output of the comparator 14 rises at a point shifted by 90° from when the input signal becomes L. A signal indicated by C is obtained in the figure where the input signal falls at the end of the period of L. Namely, the output signal of the comparator 14, as shown in the figure, rises at a 90° phase from the fall of the input signal and becomes H during the 90° period.

The output signals from the comparators 14a and 14b are exactly opposite in phase, and signals C and C' shifted in phase by 180° are obtained. Furthermore, signals A and A', and signals B and B' are respectively opposite in phase.

Outputs C and C' of the comparators 14a and 14b are input by the reset terminal R and the set terminal S of the RS flip-flop 22. Therefore, a signal that is set by the rise of C' and reset by the rise of C is obtained at the Q output of the RS flip-flop 22, and the QB output becomes its inverse.

Signals E and E', which are the outputs of this flip-flop 22, become the first input signal and the second input signal delayed by 90°.

According to the present embodiment as described in the above, a 90° phase shifted signal can be obtained without the use of coils.

Figure 3:
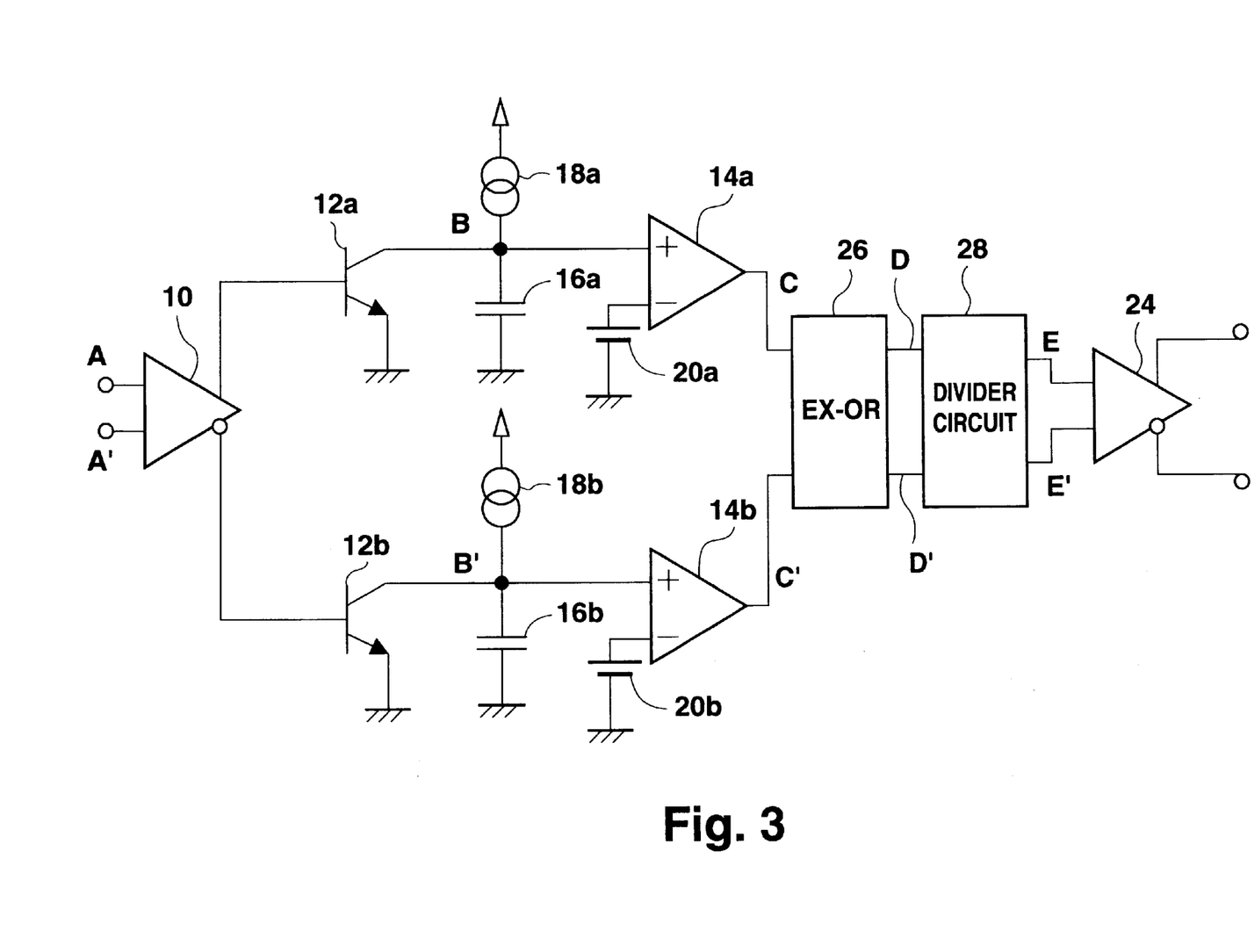
FIG. 3 shows a configuration of another embodiment.

Another embodiment is shown in FIG. 3. In this circuit, an exclusive OR circuit 26 and a divider circuit 28 are used instead of the above-mentioned flip-flop 22. As shown in FIG. 2, signals D and D', in which H and L are repeated every 90° and the rise is shifted by 90° from the input signals, are obtained by this circuit. By performing ½ division on these signals at the divider circuit 28, signals E and E', which are identical to those of the above-mentioned embodiment, can be obtained.

Since identical signals can be obtained regarding the two input signals, signals opposite in phase from each other can be obtained at the output.

Although this embodiment employs the exclusive OR circuit 26, an OR circuit can also be employed since both signals that are input by the exclusive OR circuit 26 do not have periods of H.

Figure 4:
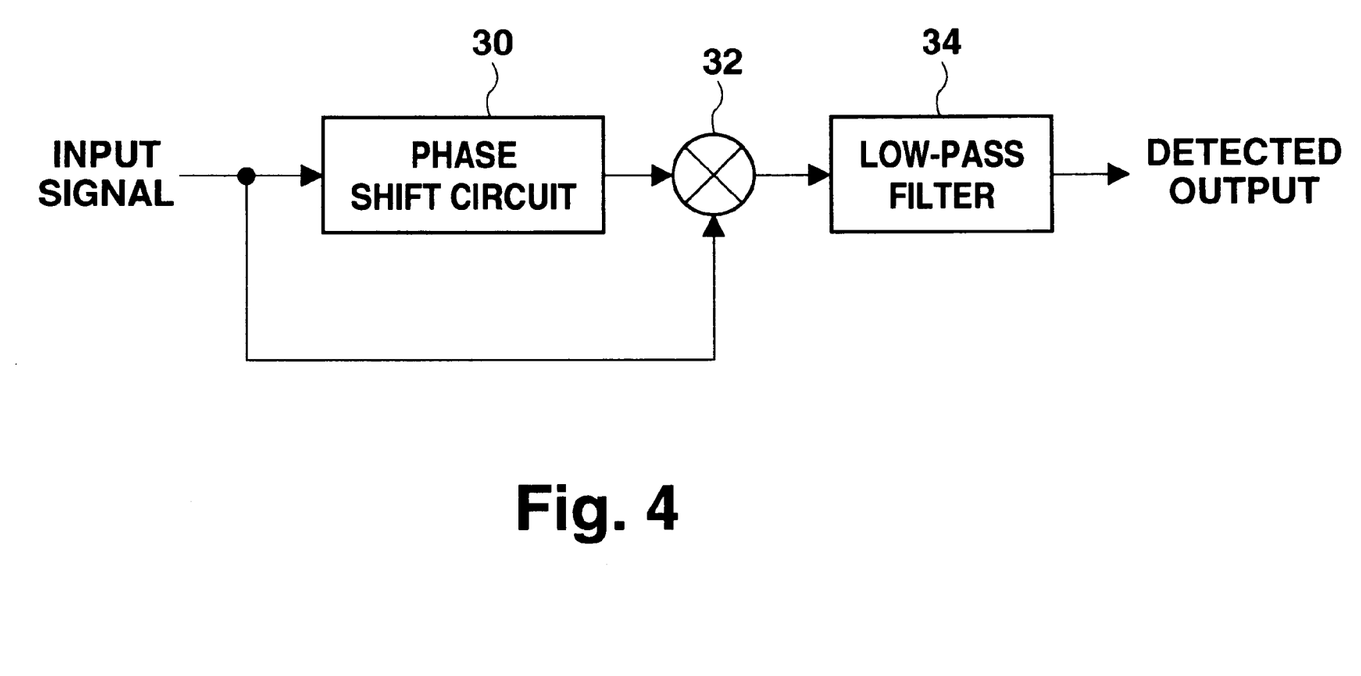
FIG. 4 shows a configuration of a detector circuit.

FIG. 4 shows a quadrature detector circuit using the above-mentioned phase shift circuit. As shown, the IF signal is input by a phase shift circuit 30, a signal shifted from the input signal by 90° is obtained at the output, and the signal is input by a multiplier 32. On the other end, the IF signal is supplied directly without change to the multiplier 32. Multiplication is performed on the input signal shifted by 90° and the present input signal. The output of this multiplier is supplied to a low-pass filter 34 and then converted to a dc signal. As a result, a level that varies according to the shift in frequency is obtained at the output of the low-pass filter 34, thereby achieving FM detection.

In FIGS. 1 to 4, although an example was given where a 90° phase was delayed with respect to the center frequency of the FM modulation signal, the present invention is not limited to this example. In other words, if the comparators 14a and 14b are set to output signals after the elapse of a predetermined time from the rise of the input signals A and A' of FIG. 2, it is not necessary to set the above-mentioned 90°. It is sufficient to determine and set a suitable optimum phase amount. To shift the phase in this manner, coils and capacitors or delay lines were used heretofore. However, according to the present invention, the delay time can be set accurately and easily by the constant current source 18a, capacitor 16a, voltage of reference voltage source 20a, and so forth.

In FIGS. 1 to 4, a fixed delay time was obtained; the derivation of which will be described hereinafter. Suppose the delay time is denoted by T0. Delay time T0 represents the time from charging the capacitors 16a and 16b so that the terminal voltages of the capacitors 16a and 16b reach a reference voltage Vref of the reference power source 20a and 20b, until the output signals of the comparators 20a and 20b invert. At the capacitors 16a and 16b in the phase shift circuit, denoting the charge stored in the capacitors 16a and 16b by Q results in $$Q = I \cdot T = C \cdot V$$

where I is the current flow per unit time, T is the time, C is the capacitance, and V is the terminal voltage of the capacitor.

Applying this relationship to the capacitors 16a and 16b results in $$Q = I \cdot T0 = C \cdot Vref$$

$$T0 = \frac{C \cdot Vref}{I} \tag{1}$$

where I is the constant current of the constant current sources 18a and 18b and C is the capacitance of the capacitors 16a and 16b. Since constant current I, capacitance C, and reference voltage Vref are fixed values, the delay time T0 can be set to a fixed time. Further, constant current I, capacitance C, and reference voltage Vref can be arbitrarily changed so that the delay time can be arbitrarily changed.

On the other hand, when the difference between the phase of the original input signal and the phase of the output signal that was shifted by the phase shift circuit of FIG. 1 or FIG. 3 is θ, the result is $$\theta = \frac{T0}{T} \times 2\pi \qquad (2)$$

where T is the period of the input signal. Thus, the proportion of the delay time to the period of the input signal signifies the phase difference. For example, if the delay time is ¼ the period of the input signal, the phase difference becomes π/2.

Substituting expression (1) for the delay time into expression (2) indicating the phase difference yields $$\theta = \frac{C \cdot Vref}{I \cdot T} \times 2\pi \quad (0 \leq \theta \leq 2\pi)$$

Denoting the frequency of the input signal by f, and from f=1/T, yields $$\theta = \frac{2\pi \cdot C \cdot Vref}{I} \times f$$

Capacitance C, reference voltage Vref, and constant current I are fixed values so that $$\theta \, f$$

Thus, the frequency of the input signal and the phase difference θ have a proportional relationship.

Figure 5A:
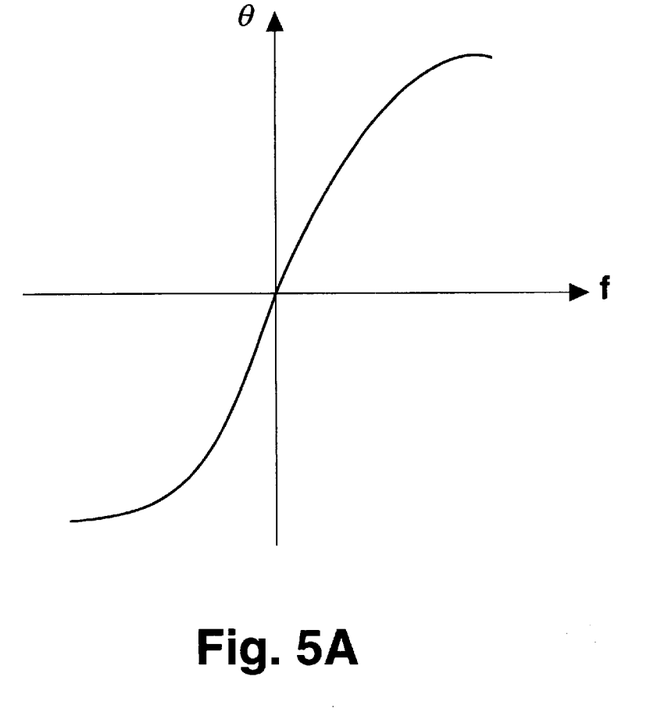
FIG. 5A shows a relationship between an ordinary input frequency and the phase difference.
Figure 5B:
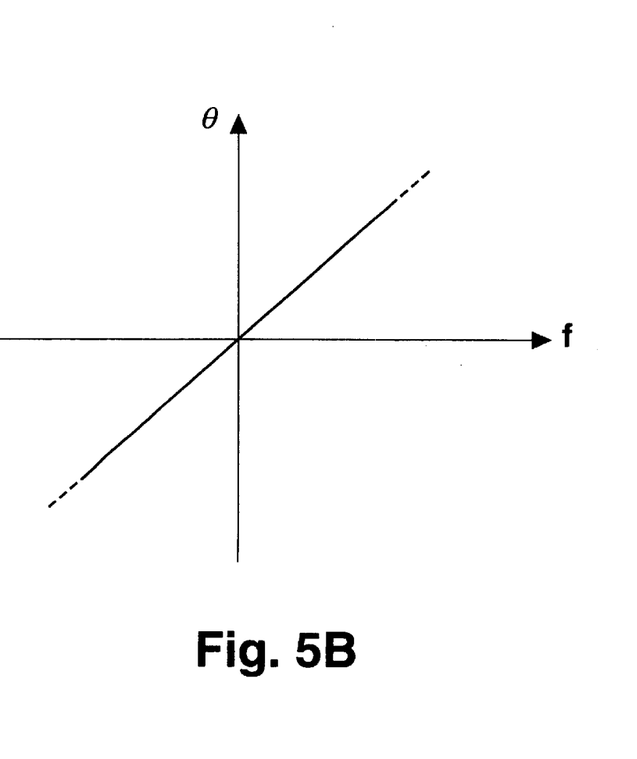
FIG. 5B shows a relationship between input frequency and phase difference in the present invention.

The quadrature FM detector circuit has a so-called S curve characteristic for the relationship between the input frequency and the phase difference as shown in FIG. 5A. Using the phase shift circuit improves the linearity of the frequency and the phase difference as shown in FIG. 5B and improves the distortion rate of the FM demodulated signal.

Figure 6:
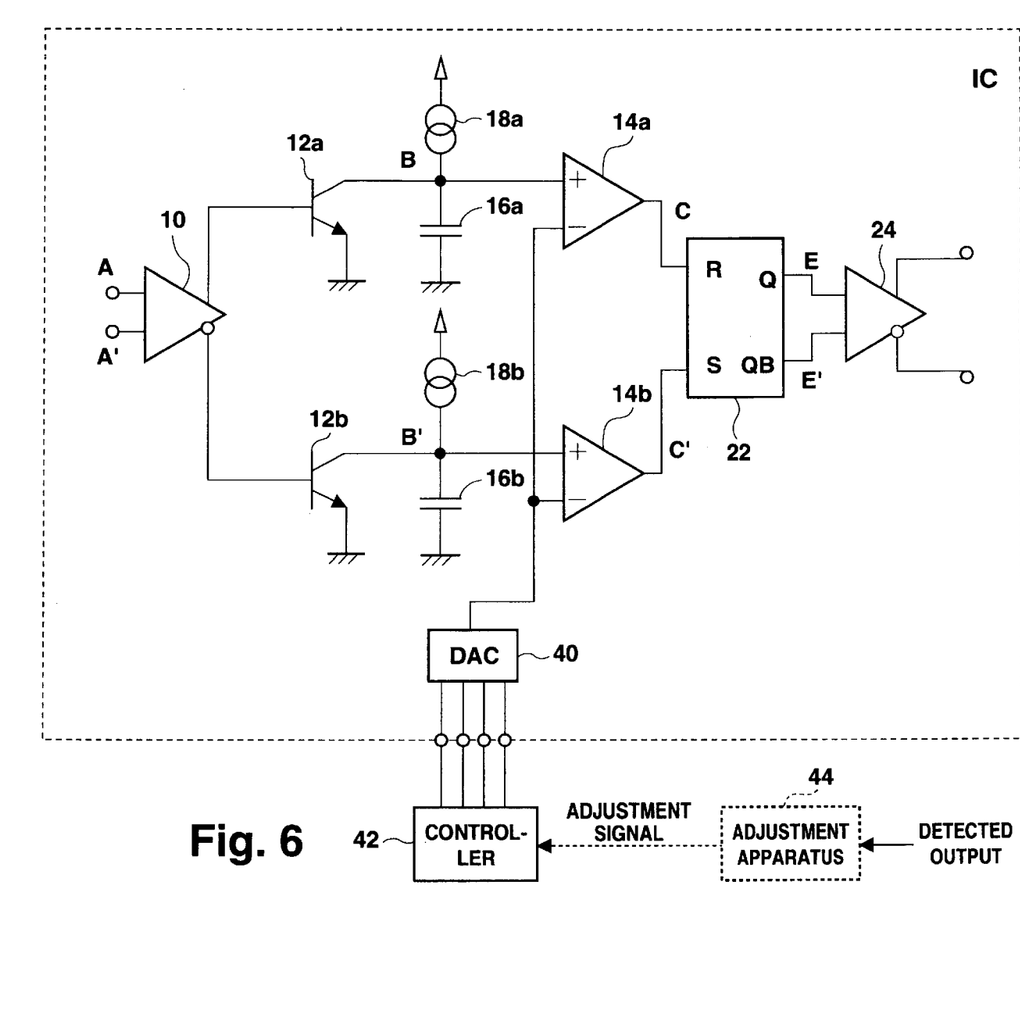
FIG. 6 shows another embodiment.

FIG. 6 shows another embodiment of the present invention. Instead of the reference voltage sources 20a and 20b, an output of a D/A converter circuit 40 is connected. The D/A converter circuit 40 is connected, for example, via external pins of an IC or a port of a controller 42, such as of a PLL controller or microcomputer, as shown in FIG. 6. Thus, the output level of the D/A converter circuit can be controlled by the external controller circuit 42, and the reference level of the comparator 14a and 14b can be varied so that the delay time can be easily varied. As a result, the phase difference with respect to the center frequency of the FM demodulator circuit can be adjusted externally to an appropriate value.

In particular, the FM demodulator characteristic can be adjusted even after completing the assembly of a radio receiver set. Specifically, the present invention is applicable to the automatic adjustment of the FM demodulator circuit in the production line of radio receiver sets. Namely, an adjustment apparatus 44 is connected to the radio receiver so that the radio receiver is made to receive an input signal with respect to the center frequency of the FM signal. The FM signal of the center frequency is input by the FM demodulator circuit, the demodulation level is compared with a reference value at the adjustment apparatus 44, an adjustment signal is calculated so that the comparison output becomes 0, and the adjustment signal is input by the D/A converter via the above-mentioned port or external pins. A voltage corresponding to the adjustment signal is generated from the D/A converter circuit 40, which becomes the reference voltage of the comparators 14a and 14b. As a result, the delay time is adjusted and the FM demodulation characteristic is improved to an appropriate value. At the end of the adjustment, the adjustment apparatus 44 is disconnected from the FM receiver set.

The use of the D/A converter circuit 40 enables temperature compensation to be easily realized. By storing and executing a program for temperature compensation in the controller circuit 42, such as of a PLL controller or microcomputer, the characteristic of the FM demodulator circuit can be improved through temperature compensation. Namely, if the demodulator circuit is integrated into an IC, the change in IC temperature due to the ambient temperature of the IC and the heat generated within the IC causes the characteristic of the FM demodulator circuit to fluctuate. A table storing the relationship between IC temperature and correction value is set beforehand in the controller circuit and the correction value corresponding to the temperature change is calculated. Digital data in which the correction value has been included is applied to the D/A converter circuit 40 so that the delay time for the phase shift circuit can be thermally compensated and the characteristic of the FM demodulator circuit can be compensated.

Figure 7:
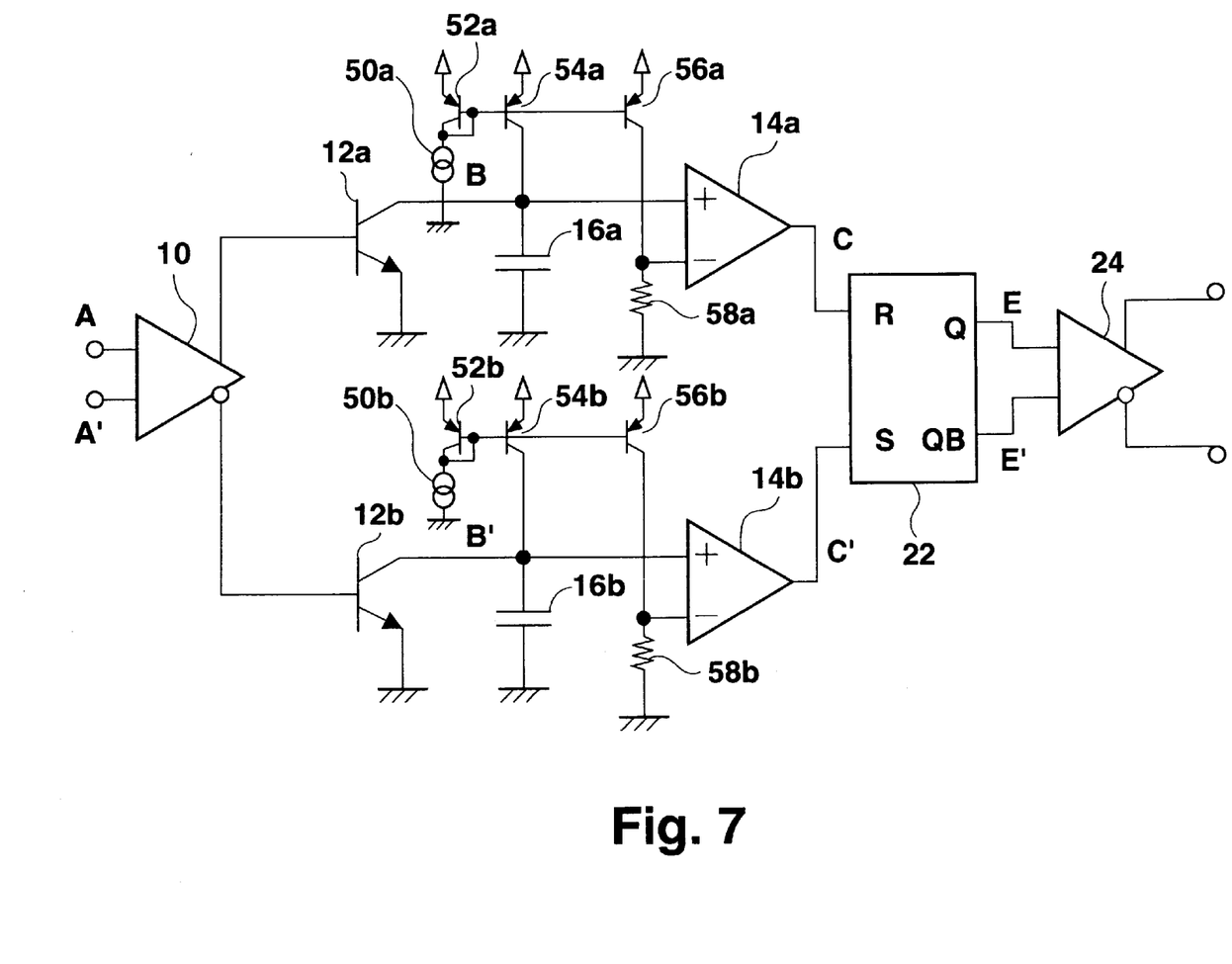
FIG. 7 shows another embodiment.

Furthermore, as a means for temperature compensation, the constant current sources 18a and 18b and the voltage sources 20a and 20b can be implemented from the same current source as shown in FIG. 7. Setting the values of the current sources and the resistors so as to cancel the temperature characteristic between the output current of the current sources and the voltage of the negative input of the comparator 14a, 14b enables the delay time to be constant regardless of any temperature changes. Namely, the constant current, which flows to constant current sources 50a and 50b, flows to PNP-type current-mirror input transistors 52a and 52b having a short between the collector and base. To the base of the transistor 52a are connected the bases of PNP transistors 54a and 56a. The same current flowing through the transistor 52a flows through the transistors 54a and 56a. Furthermore, to the base of the transistor 52b are connected the bases of PNP transistors 54b and 56b. The same current flowing through the transistor 52b flows through the transistors 54b and 56b. The transistors 52a and 52b respectively supply current to the upper end of the capacitors 16a and 16b and to the positive input end of the comparators 14a and 14b. On the other hand, the transistors 56a and 56b supplies current to ground via the resistors 58a and 58b. Therefore, a constant voltage is obtained at the upper end of the resistors 58a and 58b. they are connected to the negative input end of the comparators 14a and 14b. As a result, the constant current sources 50a and 50b operate as constant current sources for the capacitors 16a and 16b and as low voltage sources for the negative input ends of the comparators 14a and 14b.

The resistors 58a and 58b are formed as diffused resistors and temperature characteristics of the resistor 58a and 58b are set at an appropriate value so that the voltage changes of the positive input terminals of comparators 14a and 14b due to temperature change are compensated by the voltage change of the negative input terminal of the comparators 14a and 14b.

Although FIGS. 6 and 7 are based on FIG. 1, they may of course be applied to FIG. 3.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A phase shift circuit for shifting phase of a rectangular wave input signal by a predetermined time for output, said phase shift circuit comprising:

a first switch for accepting a first input signal and for turning on and off;

a first capacitor that is charged by constant current from a constant current source and discharged by the first switch;

a first comparator for comparing charging voltage of the first capacitor with a reference voltage and obtaining an output having rise timing shifted by a predetermined time from the first input signal;

a second switch for accepting a second input signal that is out of phase by 180° with the first input signal and for turning on and off;

a second capacitor that is charged by constant current from the constant current source and discharged by the second switch;

a second comparator for comparing charging voltage of the second comparator with the reference voltage; and signal processing circuit for obtaining, on the basis of outputs from the first and second comparators, signals having phase shifted by predetermined time with respect to the first and second input signals.

2. A phase shift circuit according to claim 1 wherein said signal processing circuit is a flip-flop that is set by the second comparator output and reset by the first comparator output.

3. A phase shift circuit according to claim 1 wherein said signal processing circuit comprises:

a logic circuit for performing exclusive OR or OR operations on outputs of both comparators; and a divider circuit for dividing the output of the logic circuit.

4. An FM detector circuit including;

a phase shifter comprising a delay apparatus for delaying an input signal by a predetermined time; and a multiplier for multiplying said input signal and an output of said phase shifter;

wherein said phase shifter comprises:

a first switch for accepting a first input signal and for turning on and off;

a first capacitor that is charged by constant current from a constant current source and discharged by the first switch;

a first comparator for comparing charging voltage of the first capacitor with reference voltage and obtaining an output having rise timing shifted by a predetermined time from the first input signal;

a second switch for accepting a second input signal differing in phase from the first input signal by 180° and turning on and off;

a second capacitor that is charged by constant current from the constant current source and discharged by the second switch;

a second comparator for comparing charging voltage of the second capacitor with reference voltage; and signal processing circuit for obtaining, on the basis of outputs of the first and second comparators, signals having phase shifted by a predetermined time with respect to the first and second input signals.

5. A phase shift circuit according to claim 4 wherein said signal processing circuit is a flip-flop that is set by the second comparator output and reset by the first comparator output.

6. A phase shift circuit according to claim 4 wherein said signal processing circuit comprises:

a logic circuit for obtaining exclusive OR or OR of both comparator outputs; and a divider circuit for dividing the output of the logic circuit.

* * * * *